(12) United States Patent
Lee et al.

(10) Patent No.: US 12,438,103 B2
(45) Date of Patent: Oct. 7, 2025

(54) TRANSISTOR INCLUDING A DISCONTINUOUS BARRIER LAYER

(71) Applicant: Wolfspeed, Inc., Durham, NC (US)

(72) Inventors: Kyoung-Keun Lee, Cary, NC (US); Jia Guo, Apex, NC (US)

(73) Assignee: Wolfspeed, Inc., Durham, NC (US)

( * ) Notice: Subject to any disclaimer, the term of this patent is extended or adjusted under 35 U.S.C. 154(b) by 672 days.

(21) Appl. No.: 17/733,939

(22) Filed: Apr. 29, 2022

(65) Prior Publication Data

US 2023/0352424 A1    Nov. 2, 2023

(51) Int. Cl.
| | |
|---|---|
| *H01L 21/8238* | (2006.01) |
| *H01L 23/00* | (2006.01) |
| *H01L 23/31* | (2006.01) |
| *H10D 30/47* | (2025.01) |
| *H10D 64/00* | (2025.01) |

(52) U.S. Cl.
CPC ........ *H01L 23/564* (2013.01); *H01L 23/3171* (2013.01); *H01L 23/3192* (2013.01); *H10D 30/475* (2025.01); *H10D 64/111* (2025.01)

(58) Field of Classification Search
CPC ............... H01L 23/564; H01L 23/3171; H01L 23/3192; H01L 21/765; H01L 21/02488; H01L 2924/13062; H01L 23/4824; H01L 23/49568; H01L 23/49582; H01L 23/49586; H01L 23/291; H01L 23/5256; H10D 64/111; H10D 62/8503; H10D 30/475; H10D 30/015; H10D 64/254; H10D 64/411; H10D 62/824; H10D 30/60; H10D 62/221; H10D 30/47; H10D 30/87; H10D 64/256; H10D 10/021; H10D 10/80; H10D 64/516; H10D 64/514; H10D 12/411; H10D 30/4732; H10D 62/815; H10D 84/05; H10D 30/4755; H10D 64/511; H10D 30/478; H10D 30/477; H10D 30/675; H10D 62/235; H10D 62/364; H10D 64/112; H10D 84/811; H10D 62/85; H10D 30/0291; H10D 84/84; H10D 30/021; H10D 30/025; H10D 30/6713; H10D 62/116; H10D 8/605; H10D 84/83; H10D 62/852; H10D 64/257; H10D 64/602; H10D 12/031; H10D 30/031; H10D 62/151; H10D 64/251; H10D 64/311
See application file for complete search history.

(56) References Cited

U.S. PATENT DOCUMENTS

| | | |
|---|---|---|
| 6,849,882 B2 | 2/2005 | Chavarkar et al. |
| 7,126,426 B2 | 10/2006 | Mishra et al. |
| 7,230,284 B2 | 6/2007 | Parikh et al. |
| 7,501,669 B2 | 3/2009 | Parikh et al. |
| 7,550,783 B2 | 6/2009 | Wu et al. |
| 7,573,078 B2 | 8/2009 | Wu et al. |
| 9,496,458 B2 | 11/2016 | Donofrio et al. |

(Continued)

*Primary Examiner* — Niki H Nguyen
(74) *Attorney, Agent, or Firm* — Sage Patent Group

(57) ABSTRACT

A transistor includes a first passivation layer on a semiconductor layer of the transistor between a source contact and a drain contact. The first passivation layer includes a portion having a topological change. The transistor further includes a discontinuous barrier layer on the portion of the first passivation layer having the topological change. The discontinuous barrier layer is configured to reduce ingress of moisture in the portion of the first passivation layer.

43 Claims, 9 Drawing Sheets

(56) References Cited

U.S. PATENT DOCUMENTS

| | | |
|---|---|---|
| 9,847,411 B2 | 12/2017 | Sriram et al. |
| 10,957,830 B2 | 3/2021 | Williams et al. |
| 2005/0253167 A1 | 11/2005 | Wu et al. |
| 2006/0202272 A1 | 9/2006 | Wu et al. |
| 2008/0128752 A1 | 6/2008 | Wu |
| 2010/0276698 A1 | 11/2010 | Moore et al. |
| 2012/0049973 A1 | 3/2012 | Smith, Jr. et al. |
| 2012/0194276 A1 | 8/2012 | Fisher |
| 2022/0384366 A1* | 12/2022 | Lee ............... H01L 23/564 |

* cited by examiner

TRANSISTOR INCLUDING A DISCONTINUOUS BARRIER LAYER

FIELD

The present disclosure relates to a transistor, in particular a transistor including a discontinuous barrier layer on a portion of a passivation layer having topological change. The discontinuous barrier layer is configured to reduce ingress of moisture in the portion of the passivation layer.

BACKGROUND

Narrow bandgap semiconductor materials, such as silicon (Si) and gallium arsenide (GaAs), are widely used in semiconductor devices for low power and, in the case of Si, low frequency applications. However, these semiconductor materials may not be well-suited for high power and/or high frequency applications, for example, due to their relatively small bandgaps (1.12 eV for Si and 1.42 for GaAs at room temperature) and relatively small breakdown voltages.

Interest in high power, high temperature and/or high frequency applications and devices has focused on wide bandgap semiconductor materials such as silicon carbide (3.2 eV for 4H—SiC at room temperature) and the Group III nitrides (e.g., 3.36 eV for GaN at room temperature). These materials may have higher electric field breakdown strengths and higher electron saturation velocities than GaAs and Si.

A device of particular interest for high power and/or high frequency applications is the High Electron Mobility Transistor (HEMT), which is also known as a modulation doped field effect transistor (MODFET). In a HEMT device, a two-dimensional electron gas (2DEG) may be formed at the heterojunction of two semiconductor materials with different bandgap energies, where the smaller bandgap material has a higher electron affinity than the wider bandgap material. The 2DEG is an accumulation layer in the undoped smaller bandgap material and can contain a relatively high sheet electron concentration, for example, in excess of $10^{13}$ carriers/cm$^2$. Additionally, electrons that originate in the wider bandgap semiconductor may transfer to the 2DEG, allowing a relatively high electron mobility due to reduced ionized impurity scattering. This combination of relatively high carrier concentration and carrier mobility can give the HEMT a relatively large transconductance and may provide a performance advantage over metal-semiconductor field effect transistors (MESFETS) for high-frequency applications.

HEMTs fabricated in the gallium nitride/aluminum gallium nitride (GaN/AlGaN) material system can generate large amounts of RF power due to a combination of material characteristics, such as relatively high breakdown fields, relatively wide bandgaps, relatively large conduction band offset, and/or relatively high saturated electron drift velocity. A major portion of the electrons in the 2DEG may be attributed to polarization in the AlGaN.

FIG. 1 illustrates a conventional gallium nitride-based HEMT structure. The structure includes a substrate 10, which may be a semi-insulating 4H silicon carbide (SiC) substrate. Optional buffer, nucleation and/or transition layers (not shown) may be provided on the substrate 10. A channel layer 20 is provided on the substrate 10. The channel layer 20 may be a Group III-nitride, such as GaN. A barrier layer 22 is provided on the channel layer 20. The barrier layer 22 has a bandgap that is greater than the bandgap of the channel layer 20 and the channel layer 20 may have a larger electron affinity than the barrier layer 22. The barrier layer 22 may be AlN, AlInN, AlGaN or AlInGaN, and is thick enough and has a high enough Al composition and doping to induce a significant carrier concentration at the interface between the channel layer 20 and the barrier layer 22. This induced carrier concentration forms a 2DEG which provides a conductive channel in the device. The conductivity of the 2DEG channel can be modulated by applying a voltage to a gate contact 32 formed on the barrier layer 22.

FIG. 1 also illustrates a cap layer 24 on the barrier layer 22 with the gate contact 32 in a recess 36 through the cap layer 24. The cap layer 24 moves the top (outer) surface of the device physically away from the channel, which may reduce surface effects of the device. The cap layer 24 may be blanket formed on the barrier layer 22 and may be epitaxially grown and/or formed by deposition. Typically, the cap layer 24 may have a thickness of from about 2 nm to about 500 nm.

As is further illustrated in FIG. 1, ohmic source/drain contacts 30 are provided on the barrier layer 22, and a gate recess is provided through the cap layer 24 to expose a portion of the barrier layer 22. A gate contact 32 is formed in the recess and contacts the exposed portion of the barrier layer 22. The gate contact 32 may be a "T" gate as illustrated in FIG. 1.

Semiconductor components (e.g., transistors) may need to withstand a certain amount of their life cycle in humid conditions while operating. Insufficiently designed and/or processed chips or devices including transistors may exhibit failure mechanisms that occur before the expected operating life.

SUMMARY

A transistor according to some embodiments includes a first passivation layer on a semiconductor layer of the transistor between a source contact and a drain contact. The first passivation layer comprises a portion having a topological change. The transistor further comprises a discontinuous barrier layer on the portion of the first passivation layer having the topological change. The discontinuous barrier layer is configured to reduce ingress of moisture in the portion of the first passivation layer.

In some embodiments, the transistor includes a gate contact between the source contact and the drain contact; and a field plate on a portion of the gate contact adjacent to the drain contact. The portion of the first passivation layer having the topological change is on the field plate and the discontinuous barrier layer is on the portion of the first passivation layer.

The discontinuous barrier layer may have a thickness that is in a range between about 25 nm to about 600 nm.

The field plate may have a thickness that is thicker than a thickness of the discontinuous barrier layer.

The thickness of the field plate may be greater than about 600 nm and the thickness of the discontinuous barrier layer may be in a range between about 25 nm to less than about 600 nm.

The discontinuous barrier layer may be a metal layer formed by a single metal comprising one of aluminum, gold, silver, silicon, titanium, and tantalum and the gate contact, the source contact, and the field plate, respectively, may comprise a plurality of metals.

In some embodiments, the plurality of metals does not include aluminum.

In some embodiments, the discontinuous barrier layer does not contact to an electrical ground.

In some embodiments, the transistor includes a second passivation layer on the first passivation layer; and the discontinuous barrier layer is between the first passivation layer and the second passivation layer.

The discontinuous barrier layer may extend over an entirety of the portion having the topological change.

The discontinuous barrier layer may partially extend over the portion having the topological change.

The discontinuous barrier layer may at least partially extend over the portion having the topological change adjacent the source contact.

The discontinuous barrier layer may extend at least partially over the portion having the topological change adjacent the drain contact.

A length of the discontinuous barrier layer may have a first end that extends from about a first edge of the gate contact and a second end that may be closer to the first edge of the gate contact than to the drain contact.

A length of the discontinuous barrier layer may have a first end that that extends from a portion of the gate contact and a second end that may be closer to a first edge of the gate contact than to the drain contact.

A length of the discontinuous barrier layer may have a first end the covers the gate contact and a second end that may be closer to a first edge of the gate contact than to the drain contact.

A length of the discontinuous barrier layer may have a first end that extends from about a first edge of the gate contact and a second end that may be closer to the drain contact than to the first edge of the gate contact.

A length of the discontinuous barrier layer may have a first end that that extends from a portion of the gate contact and a second end that may be closer to the drain contact than to a first edge of the gate contact.

A length of the discontinuous barrier layer may have a first end the covers the gate contact and a second end that may be closer to the drain contact than to a first edge of the gate contact.

In some embodiments, the transistor includes a plurality of additional passivation layers having a respective portion of topological change on the first passivation layer; and a plurality of additional discontinuous barrier layers. The plurality of additional discontinuous passivation layers are positioned according to at least one of the following (i) between the first passivation layer and the second passivation layer, and (ii) respective ones of the additional discontinuous barrier layers are positioned between respective portions of topological change of the additional passivation layers.

The transistor may be a HEMT.

A transistor according to some embodiments includes a first passivation layer on a semiconductor layer of the transistor between a source contact and a drain contact. The first passivation layer comprising a first portion having a topological change. The transistor further includes a first discontinuous barrier layer on the first portion of the first passivation layer having the topological change. The transistor further includes a second passivation layer on the first passivation layer on the semiconductor layer of the transistor between the source contact and the drain contact. The second passivation layer comprises a second portion having a topological change. The transistor further includes a second discontinuous barrier layer on the second portion of the second passivation layer having the topological change. The first and the second discontinuous barrier layers are configured to reduce ingress of moisture in the portions of the first and second passivation layers.

In some embodiments, the transistor includes a gate contact between the source contact and the drain contact; and a field plate on a portion of the gate contact adjacent to the drain contact. The portion of the first passivation layer having the topological change is on the field plate and the first discontinuous barrier layer is on the portion of the first passivation layer, and the second discontinuous barrier layer is on the portion of the second passivation layer.

The first and the second discontinuous barrier layers, respectively, may have a thickness that is in a range between about 25 nm to about 600 nm.

The field plate may have a thickness that is thicker than a thickness of the first and the second discontinuous barrier layers.

The thickness of the field plate may be greater than about 600 nm and the thickness of the first and the second discontinuous barrier layers, respectively, may be in a range between about 25 nm to less than about 600 nm.

The first and the second discontinuous barrier layers, respectively, may be a metal layer formed by a single metal comprising one of aluminum, gold, silver, silicon, titanium, and tantalum and the gate contact, the source contact, and the field plate, respectively, comprise a plurality of metals.

In some embodiments, the plurality of metals does not include aluminum.

In some embodiments, the first and the second discontinuous barrier layers, respectively, do not contact to an electrical ground.

In some embodiments, the transistor includes a third passivation layer on the second passivation layer; and the first discontinuous barrier layer is between the first passivation layer and the second passivation layer, and the second discontinuous barrier layer is between the second passivation layer and the third passivation layer.

At least one of the first and the second discontinuous barrier layers, respectively, may extend over an entirety of the respective first portion and/or second portion having the topological change.

At least one of the first and the second discontinuous barrier layers, respectively, may partially extend over the respective first portion and/or second portion having the topological change.

At least one of the first and the second discontinuous barrier layers, respectively, may at least partially extends over the respective first portion and/or second portion having the topological change adjacent the source contact.

At least one of the first and the second discontinuous barrier layers, respectively, may extend at least partially over the respective first portion and/or second portion having the topological change adjacent the drain contact.

The second discontinuous barrier layer may have a first end that extends from about a first edge of the gate contact and a second end that may cover at least a portion of the gate contact and/or the field plate.

A length of the first discontinuous barrier layer may have a first end that extends from about a first edge of the gate contact and a second end that may be closer to the first edge of the gate contact than to the drain contact.

A length of the first discontinuous barrier layer may have a first end that that extends from a portion of the gate contact and a second end that may be closer to a first edge of the gate contact than to the drain contact.

A length of the first discontinuous barrier layer may have a first end the covers the gate contact and a second end that may be closer to a first edge of the gate contact than to the drain contact.

A length of the first discontinuous barrier layer may have a first end that extends from about a first edge of the gate contact and a second end that may be closer to the drain contact than to the first edge of the gate contact.

A length of the first discontinuous barrier layer may have a first end that that extends from a portion of the gate contact and a second end that may be closer to the drain contact than to a first edge of the gate contact.

A length of the first discontinuous barrier layer may have a first end the covers the gate contact and a second end that may be closer to the drain contact than to a first edge of the gate contact.

In some embodiments, the transistor includes a plurality of additional passivation layers having a respective portion of topological change on one of the first passivation layer and the second passivation layer; and a plurality of additional discontinuous barrier layers. The plurality of additional discontinuous passivation layers are positioned according to at least one of the following (i) between the first passivation layer and the second passivation layer, and (ii) respective ones of the additional discontinuous barrier layers are positioned between respective portions of topological change of the additional passivation layers.

The transistor may be a HEMT.

DETAILED DESCRIPTION OF EMBODIMENTS

Figure 1:
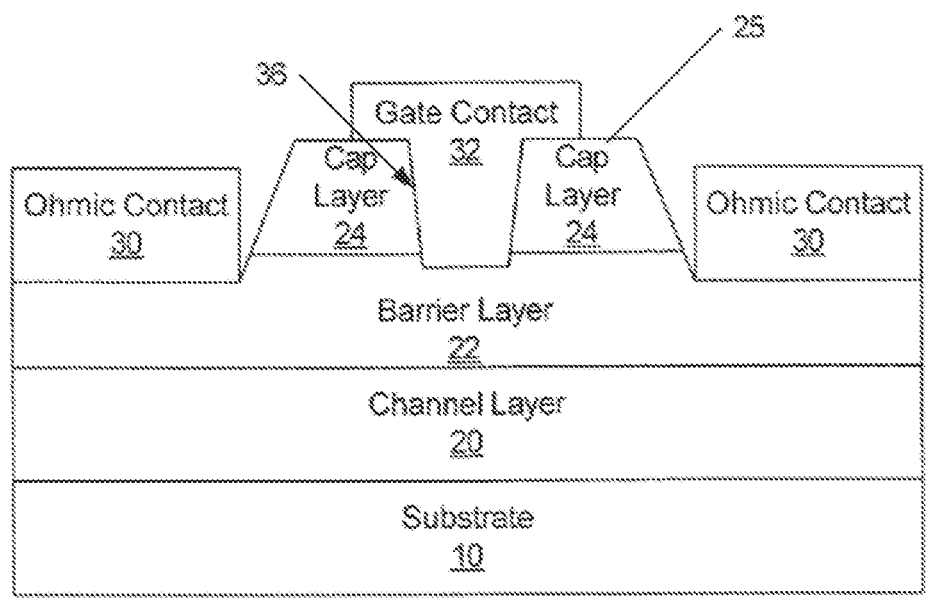
FIG. 1 is a cross-sectional view of a conventional transistor device.

Embodiments of the inventive concepts will now be described in connection with the accompanying drawings. Some embodiments described herein provide a transistor including a first passivation layer on a semiconductor layer of the transistor between a source contact and a drain contact. The first passivation layer includes a portion having a topological change. The transistor further includes a discontinuous barrier layer on the portion of the first passivation layer having the topological change. The discontinuous barrier layer is configured to reduce ingress of moisture in the portion of the first passivation layer.

It is understood that, although the ordinal terms first, second, third, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

Furthermore, relative terms, such as "lower" or "bottom" and "upper" or "top," may be used herein to describe the relationship of one element to another as illustrated in the drawings. It is understood that relative terms are intended to encompass different orientations of the device in addition to the orientation depicted in the drawings. For example, if the device in one of the drawings is turned over, features described as being on the "lower" side of an element would then be oriented on "upper" side of that element. The exemplary term "lower" can therefore describe both lower and upper orientations, depending on the particular orientation of the device. Similarly, if the device in one of the drawings is turned over, elements described as "below" or "beneath" other elements would then be oriented above those other elements. The exemplary terms "below" or "beneath" can therefore describe both an orientation of above and below.

The terminology used in the description of the disclosure herein is for the purpose of describing particular embodiments only and is not intended to be limiting of the disclosure. As used in the description of the disclosure and the appended claims, the singular forms "an" and "the" are intended to include the plural forms as well, unless the context clearly indicates otherwise. It is also understood that the term "and/or" as used herein refers to and encompasses any and all possible combinations of one or more of the associated listed items. It will be further understood that the terms "comprises" and "comprising," when used in this specification, specify the presence of stated steps, operations, features, elements, and/or components, but do not preclude the presence or addition of one or more other steps, operations, features, elements, components, and/or groups thereof.

Embodiments of the disclosure are described herein with reference to cross-sectional view illustrations that are schematic illustrations of idealized embodiments of the disclosure. As such, variations from the shapes of the illustrations as a result, for example, of manufacturing techniques and/or tolerances, are to be expected. Thus, embodiments of the disclosure should not be construed as limited to the particular shapes or thicknesses of regions illustrated herein but are to include deviations in shapes and thicknesses that result, for example, from manufacturing. The regions illustrated in the drawings are schematic in nature, and their shapes and thicknesses are not intended to illustrate the actual shape or thickness of a region of a semiconductor die and are not intended to limit the scope of the disclosure unless explicitly stated otherwise. Further, lines that appear straight, horizontal, or vertical in the below drawings for schematic reasons will often be sloped, curved, non-horizontal, or non-vertical.

Unless otherwise defined, all terms used in disclosing embodiments of the disclosure, including technical and scientific terms, have the same meaning as commonly understood by one of ordinary skill in the pertinent art and are not necessarily limited to the specific definitions known at the time of the present disclosure. Accordingly, these terms can include equivalent terms that are created after such time. It is further understood that terms, such as those defined in commonly used dictionaries, should be interpreted as having a meaning that is consistent with their meaning in the present specification and in the context of the relevant art.

Humidity protection on semiconductor devices, such as transistors, typically may be implemented using a final passivation film with a single layer deposited by chemical vapor deposition (CVD). Some embodiments may arise from a realization that such a CVD based film may have a material defectivity (e.g., pinholes in the CVD based film) and/or non-conformality of the CVD based film that may form moisture ingress paths through the film. Such a material defectivity and/or non-conformality may result in a reduction of the operating lifetime of the semiconductor component(s) in a humid environment.

In some approaches, such moisture ingress paths may be terminated by inserting a metal interlayer between passivation films. However, a metal interlayer positioned on top of an active area of a transistor may increase parasitic capacitance of the transistor, which may result in a degradation of RF performance of the transistor.

Some embodiments provide a transistor that includes a discontinuous barrier layer that is configured to reduce ingress of moisture in a portion of a passivation layer. The discontinuous barrier layer may result in maintaining about a same parasitic capacitance as the transistor without the discontinuous barrier layer and about the same RF performance of the transistor as the transistor without the discontinuous barrier layer.

Cross-sectional views of a transistor according to some embodiments are illustrated in FIGS. 2A-2D.

Figure 2A:
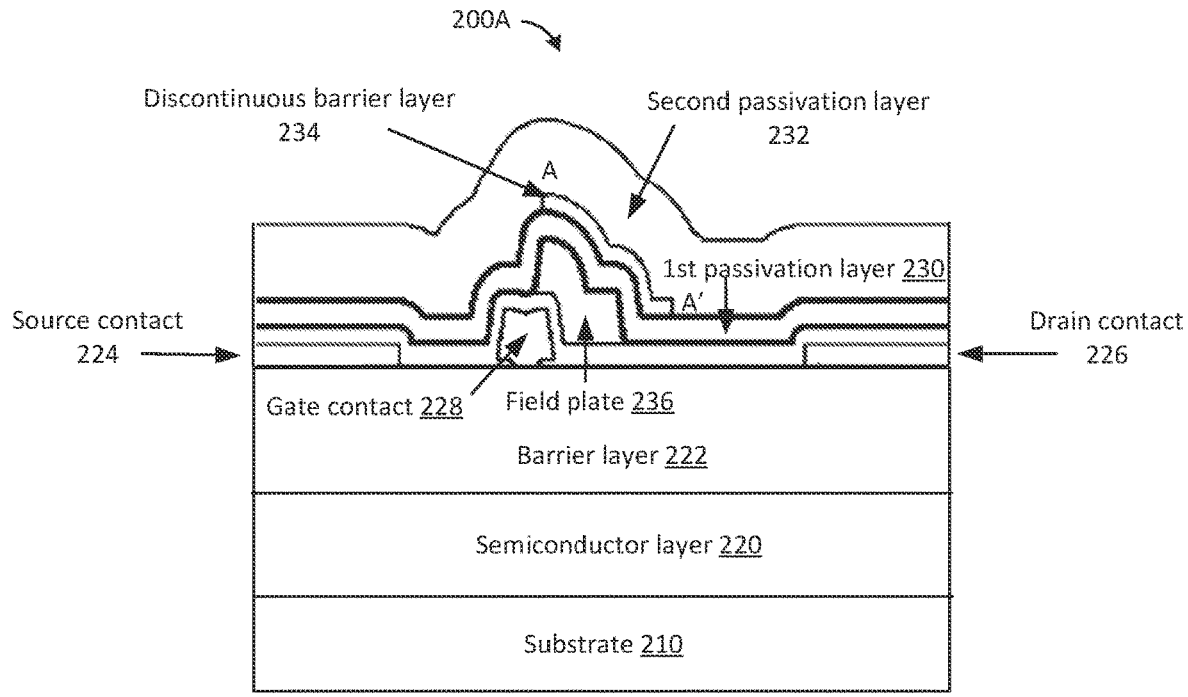
FIGS. 2A-2D are schematic cross-sectional views of a transistor according to some embodiments of the present disclosure.

As shown in FIG. 2A, the transistor 200A of a first embodiment of the present disclosure includes a substrate 210 on which a semiconductor layer 220 is formed. A barrier layer 222 is formed on the semiconductor layer 220. In some embodiments, barrier layer 222 and/or semiconductor layer 220 may be a Group III-nitride, such as GaN. The barrier layer 222 has a bandgap that is greater than the bandgap of the semiconductor layer 220 and the semiconductor layer 220 may have a larger electron affinity than the barrier layer 222. The barrier layer 222 may be AlN, AlInN, AlGaN or AlInGaN, and may be thick enough and may have a high enough Al composition and doping to induce a significant carrier concentration at the interface between the semiconductor layer 220 and the barrier layer 222. This induced carrier concentration forms a 2DEG which provides a conductive channel in the transistor. The conductivity of the 2DEG channel can be modulated by applying a voltage to a gate contact 228 formed on the barrier layer 222.

As is further illustrated in FIG. 2A, metal source and drain contacts 224, 226 are provided on the barrier layer 222 and a gate contact 228 is formed on the barrier layer 222 between the source and drain contacts 224, 226. Electric current can flow between the source and drain contacts 224, 226 through the semiconductor layer 220 when the gate contact 228 is biased at the appropriate level. The source and drain contacts 224, 226 and gate contact 228 can be made of a combination of different materials including, but not limited to, a stack(s) of different metals comprising two or more of titanium (Ti), gold (Au), platinum (Pt), nickel (Ni), etc.

A field plate 236 may be provided on a portion of the gate contact 228 adjacent to the drain contact 226. The field plate 236 can comprise many different combinations of metals including, but not limited to, a stack(s) of different metals comprising two or more of titanium (Ti), gold (Au), platinum (Pt), nickel (Ni), etc.

A first passivation layer 230 is formed on the semiconductor layer 220 between the source contact 224 and the drain contact 226. The first passivation layer 230 can be formed with many different dielectric materials, such as aluminum oxide (AlOx), silicon oxide (SiOx), silicon nitride (SiNx), hafnium oxide (HfOx), zirconium oxide (ZrOx), etc. The passivation layer can be formed using known growth methods, such as CVD.

The first passivation layer 230 can overlap or partially overlap the field plate 236 and/or gate contact 228. First passivation layer 230 includes a portion having a topological change, e.g., corresponding to about an underlying portion of topological change of the field plate 236 and/or gate contact 228.

Although not wishing to be bound by a particular theory, it is presently believed that first passivation layer 230 is porous (e.g., via pinholes in first passivation layer 230), and/or other defects (e.g., cracks) and/or non-conformities (e.g., voids) in at least a portion of the first passivation layer 230 provided over an underlying portion of topological change of field plate 236 and/or gate contact 228. The porous/defective/non-conforming portion(s) of the first passivation layer 230 may allow ingress of moisture through such porous/defective/non-conforming portion(s) of the first passivation layer 230. The ingress of moisture may reduce the operating life of the device (e.g., particularly in humid environments).

Some embodiments include a discontinuous barrier layer 234 that is provided on the portion of the first passivation layer 230 having the topological change, which may terminate/nearly terminate such moisture ingress paths.

In contrast to the source and drain contacts 224, 226, gate contact 228, and field plate 236 which each may be formed of a stack(s) of different combinations of metals, the discontinuous barrier layer 234 may be a metal layer formed by a single metal. The single metal may include, without limitation, aluminum (Al), gold (Au), silver (Ag), silicon (Si), titanium (Ti), tantalum (Ta), etc. Discontinuous barrier layer 234 may be deposited using standard metallization methods. The discontinues barrier layer 234 may be conformally formed on the portion of the first passivation layer 230 having the topological change. The discontinuous barrier layer may have a thickness that is in a range between about 25 nm to about 600 nm.

The thickness of the discontinuous barrier layer 234 may also vary depending on the particular implementation. The thickness of the discontinuous barrier layer 234 should be thick enough to provide protection from ingress of moisture and should account for a portion of an underlying passivation layer that includes a portion having a topological change. In one particular non-limiting implementation, the discontinuous barrier layer 234 is a metal layer formed by a single metal layer of aluminum (Al) and has a thickness in a range of about 25-30 nm, but may be thicker or thinner depending on factors such as, for instance, the conformality (e.g., coverage) of the portion of the underlying passivation layer having the topological change, the material used for the discontinuous barrier layer, and a conductivity of the discontinuous metal layer. It is noted that, in some embodiments, the discontinuous metal layer may not need to be fully conductive because the discontinuous barrier layer is not contacted to an electrical ground.

Depending on at least positioning and/or material, a metal layer may increase parasitic capacitance of the a transistor, which may result in a degradation of RF device performance. The discontinuous barrier layer(s) of the present disclosure is configured to reduce ingress of moisture in the portion of the first passivation layer 230 (and/or in additional passivation layers) via, for example, positioning and/or materials discussed herein. Such positioning and/or materials of the discontinuous barrier layer(s) may maintain about a same parasitic capacitance as a transistor without the discontinuous barrier layer(s).

Field plate 236 may be on a portion of the gate contact 228 adjacent to the drain contact 226. The portion of the first passivation layer 230 having the topological change may be on the field plate 236 and the discontinuous barrier layer 234 may be on the portion of the first passivation layer 230.

In some embodiments, the discontinuous barrier layer 234 is a metal layer formed by a single metal comprising one of aluminum, gold, silver, silicon, titanium, and tantalum and the gate contact 228, the source contact 224, and the field plate 236, respectively, comprises a plurality of metals. In some embodiments, the plurality of metals does not include aluminum.

The field plate 236 may have a thickness that is thicker than a thickness of the discontinuous barrier layer 234. The thickness of the field plate 236 may be greater than about 600 nm and the thickness of the discontinuous barrier layer 234 may be in a range between about 25 nm to less than about 600 nm. In a non-limiting example embodiment, a thickness of a discontinuous barrier layer 234 formed of aluminum (Al) may be in a range of about 25-30 nm to about 600 nm, while a thickness of field plate 236 may be in a range of up to several μm.

In contrast to field plate 236 which may be contacted to electrical ground, in some embodiments, the discontinuous barrier layer 234 is not connected to an electrical ground.

The transistor 200A may include a second passivation layer 232 on the first passivation layer 230. The discontinuous barrier layer 234 may be between the first passivation layer 230 and the second passivation layer 232.

In FIG. 2A, the discontinuous barrier layer 234 is provided on the portion of the first passivation layer 230 having the topological change between the source contact 224 and the drain contact 226, and partially overlaps the gate contact 228 and the field plate 236.

The discontinuous barrier layer 234 can extend different lengths A-A' between the gate contact 228 and the drain contact 226, as discussed further herein.

The length A-A' of the discontinuous barrier layer 234 may have a first end A that extends from about a first edge of the gate contact 228 and a second end A' that is closer to the first edge of the gate contact 228 than to the drain contact 226.

The length A-A' of the discontinuous barrier layer 234 may have a second end A' that extends further towards the drain contact 226 than is illustrated in FIG. 2A. That is, the length A-A' of the discontinuous barrier layer 234 may have a first end A that extends from about a first edge of the gate contact 228 and a second end A' that is closer to the drain contact 226 than to the first edge of the gate contact.

Figure 2B:
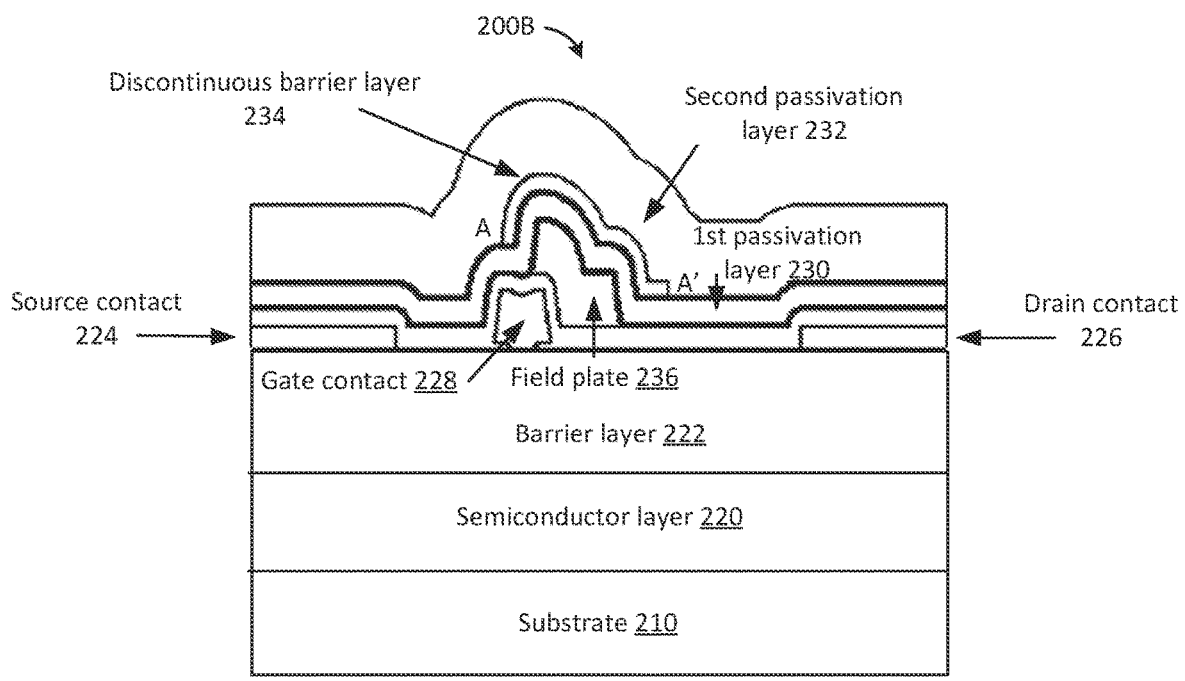

FIG. 2B shows another embodiment of a transistor 200B according to the present disclosure having many features that are similar to those in transistor 200A. For the similar features, the same reference numerals are used and the features are introduced without full description with the understanding that the description of the features above applies equally to the transistor 200B example embodiment.

The transistor 200B includes a discontinuous barrier layer 234 having a longer length A-A' than the length the discontinuous barrier layer 234 of the example embodiment of FIG. 2A. In the embodiment of FIG. 2B, the discontinuous barrier layer 234 has a length having a first end A that that extends from a portion of the gate contact 228 and a second end A' that is closer to a first edge of the gate contact than to the drain contact 226.

The length A-A' of the discontinuous barrier layer 234 may have a second end A' that extends further towards the drain contact 226 than is illustrated in FIG. 2B. That is, the length A-A' of the discontinuous barrier layer 234 may have a first end A that extends from a portion of the gate contact 228 and a second end A' that is closer to the drain contact 226 than to the first edge of the gate contact 228.

Figure 2C:
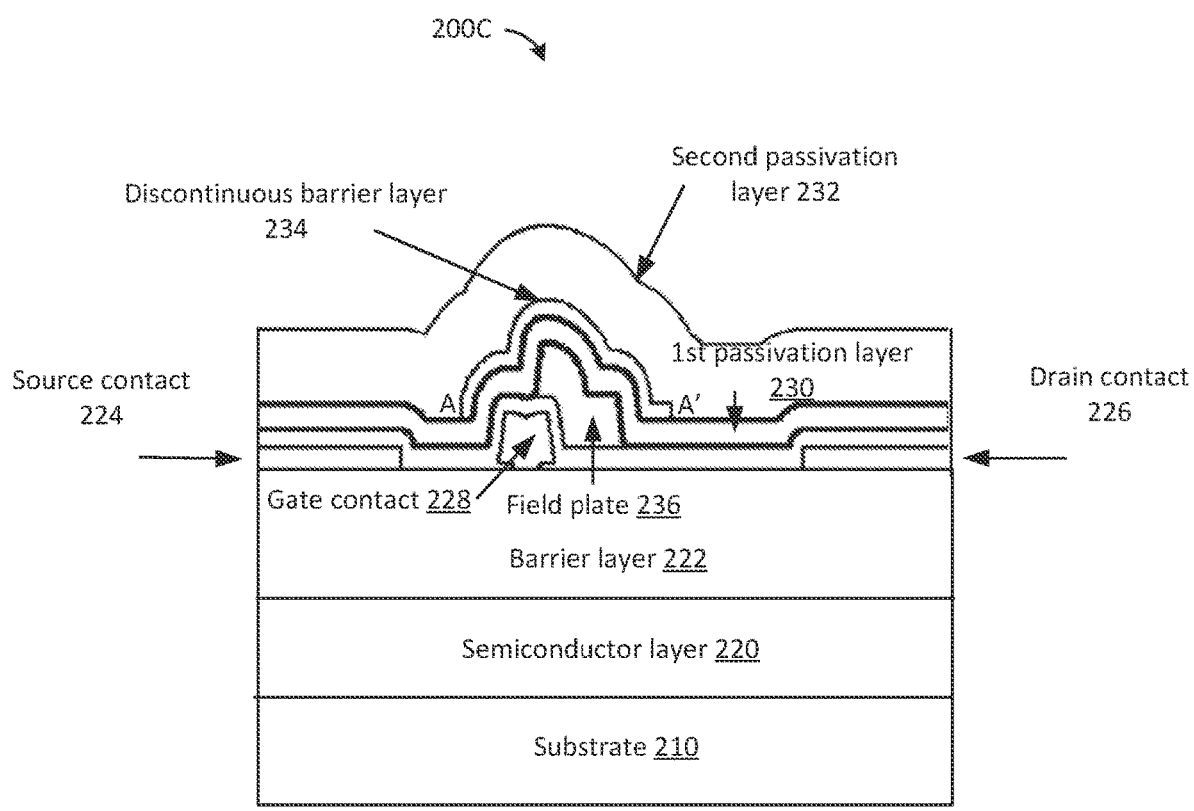

FIG. 2C shows another embodiment of a transistor 200C according to the present disclosure having many features that are similar to those in transistor 200A and/or 200B, respectively. For the similar features, the same reference numerals are used and the features are introduced without full description with the understanding that the description of the features above applies equally to the transistor 200C example embodiment.

The transistor 200C includes a discontinuous barrier layer 234 having a longer length A-A' than the length the discontinuous barrier layer 234 of the example embodiments of FIGS. 2A and/or 2B. In the embodiment of FIG. 2C, the discontinuous barrier layer 234 has a length having a first end A the covers the gate contact 228 and a second end A' that is closer to a first edge of the gate contact 228 than to the drain contact 226.

The length A-A' of the discontinuous barrier layer 234 may have a second end A' that extends further towards the drain contact 226 than is illustrated in FIG. 2C. That is, the length A-A' of the discontinuous barrier layer 234 may have a first end A that covers the gate contact 228 and a second end A' that is closer to the drain contact 226 than to the first edge of the gate contact 228.

While the example embodiments of FIGS. 2A-2C are explained in the non-limiting context of the discontinuous barrier layer 234 having the lengths discussed, the present disclosure is not so limited. Instead, positioning of the discontinuous barrier layer may include, without limitation, that the discontinuous barrier layer 234 can extend over an entirety of the portion having the topological change; can partially extend over the portion having the topological change; can at least partially extend over the portion having the topological change adjacent the source contact 224; and/or can extend at least partially over the portion having the topological change adjacent the drain contact 226.

Figure 2D:
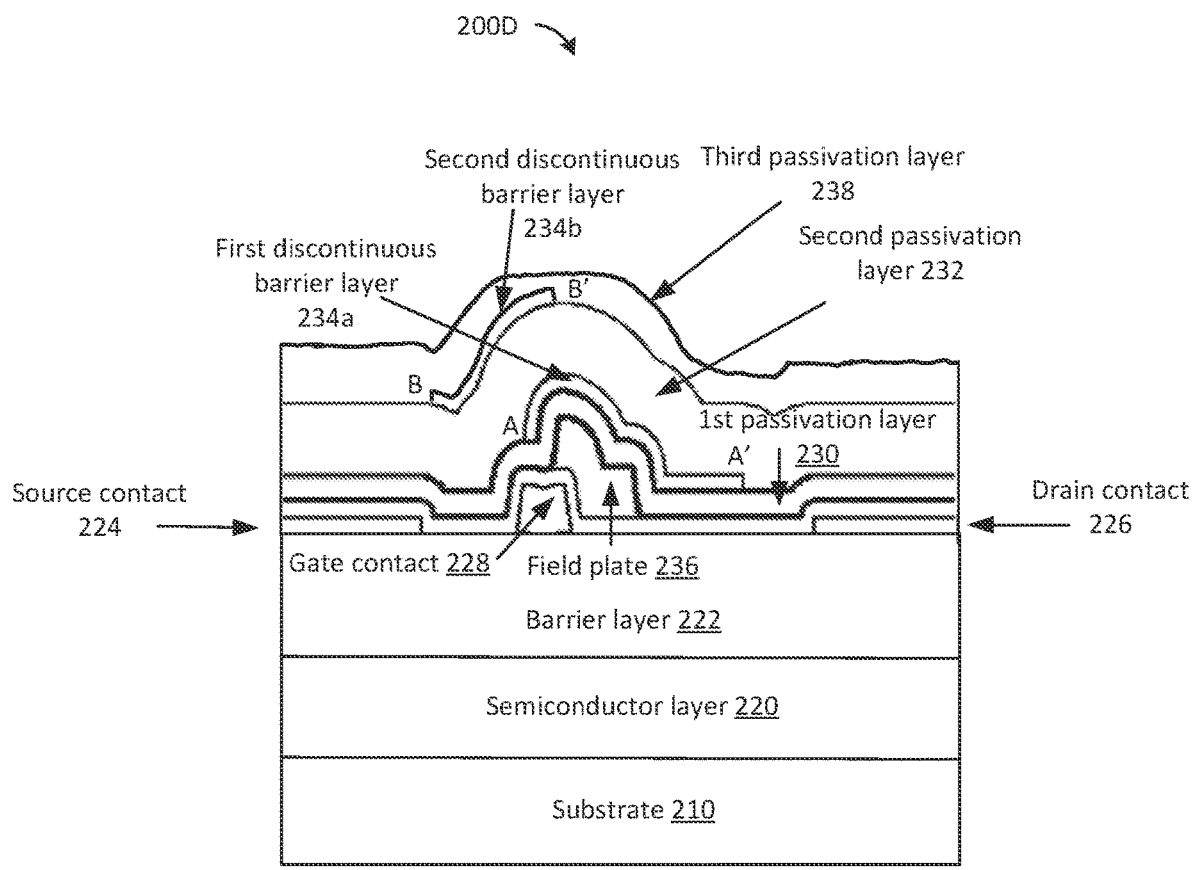

FIG. 2D shows another embodiment of a transistor 200D according to the present disclosure having many features that are similar to those in transistor 200A, 200B, and/or 200C. For the similar features, the same reference numerals are used and the features are introduced without full description with the understanding that the description of the features above applies equally to the transistor 200D example embodiment.

In the example embodiment of FIG. 2D, the discontinuous barrier layer 234 of the embodiments of FIGS. 2A-2C is referred to as first discontinuous barrier layer 234a; the transistor 200D includes a second discontinuous barrier layer 234b. The first discontinuous barrier layer 234a may have a length A-A' similar to the lengths in transistors 200A, 200B, and/or 200C. The transistor 200D further includes a third passivation layer 238.

The transistor 200D of the example embodiment of FIG. 2D includes first passivation layer 230 on semiconductor layer 220 of the transistor 200D between source contact 224 and drain contact 226. The first passivation layer 230 includes a first portion having a topological change. The transistor 200D further includes a first discontinuous barrier layer 234a on the first portion of the first passivation layer 230 having the topological change; and a second passivation layer 232 on the first passivation layer 230 on the semiconductor layer 220 of the transistor 200D between the source contact 224 and the drain contact 226. The second passivation layer 234 may include a second portion having a topological change. The transistor 200D may further include a second discontinuous barrier layer 234b on the second portion of the second passivation layer 232 having the topological change. The first and the second discontinuous barrier layers 234a, 234b are configured to reduce ingress of moisture in the portions of the first and second passivation layers 230, 232. The first and the second discontinuous barrier layers 234a, 234b may maintain about a same parasitic capacitance as the transistor without the discontinuous barrier layer.

The transistor 200D may further include a gate contact 228 between the source contact 224 and the drain contact 226. A field plate 236 may be included on a portion of the gate contact 228 adjacent to the drain contact 226. The portion of the first passivation layer 230 having the topological change may be on the field plate 236 and the first discontinuous barrier layer 234a may be on the portion of the first passivation layer 230. The second discontinuous barrier layer 234b may be on the portion of the second passivation layer 232. The first and the second discontinuous barrier layers, respectively, may have a thickness that is in a range between about 25 nm to about 600 nm.

The first and the second discontinuous barrier layers 234a, 234b, respectively, is a metal layer formed by a single metal comprising one of aluminum, gold, silver, silicon, titanium, and tantalum. The gate contact 228, the source contact 224, and the field plate 236, respectively, comprise a plurality of metals. The plurality of metals does not include aluminum.

The field plate 236 may have a thickness that is thicker than a thickness of the first and the second discontinuous barrier layers 234a, 234b, respectively. The thickness of the field plate 236 may be greater than about 600 nm and the thickness of the first and the second discontinuous barrier layers 234a, 234b, respectively, may be in a range between about 25 nm to less than about 600 nm. In a non-limiting example embodiment, a thickness of a discontinuous barrier layer 234a, 234b formed of aluminum (Al) may be in a range of about 25-30 nm to about 1 μm, while a thickness of field plate 236 may be in a range of several μm.

In contrast to field plate 236 which may be contacted to electrical ground, in some embodiments, the first and the second discontinuous barrier layers 234a, 234b, respectively, do not contact to an electrical ground.

Transistor 200D of the example embodiment of FIG. 2D may further include a third passivation layer 238 on the second passivation layer 232. The first discontinuous barrier layer 234a may be between the first passivation layer 230 and the second passivation layer 232. The second discontinuous barrier layer 234b may be between the second passivation layer 232 and the third passivation layer 238.

The second discontinuous barrier layer 234b may have a first end B that extends from about a first edge of the gate contact 228 and a second end B' that covers at least a portion of the gate contact 228 and/or the field plate 236.

The transistor of the present disclosure can be a high electron mobility transistor (HEMT).

While the example embodiments of FIG. 2D is explained in the non-limiting context of the first and/or the second discontinuous barrier layers 234a, 234b having the lengths discussed, the present disclosure is not so limited. Instead, positioning of the first and/or second discontinuous barrier layers may include, without limitation, that at least one of the first and the second discontinuous barrier layers, respectively, extends over an entirety of the respective first portion and/or second portion having the topological change; at least one of the first and the second discontinuous barrier layers, respectively, partially extends over the respective first portion and/or second portion having the topological change; at least one of the first and the second discontinuous barrier layers, respectively, at least partially extends over the respective first portion and/or second portion having the topological change adjacent the source contact; and/or at least one of the first and the second discontinuous barrier layers, respectively, extends at least partially over the respective first portion and/or second portion having the topological change adjacent the drain contact.

Additionally, while example embodiments herein are explained in the non-limiting context of first, second, and/or third passivation layers, and first and second discontinuous barrier layers, the present disclosure is not so limited. Instead, any number of passivation layers and/or discontinuous barrier layers may be included. For example, multiple discontinuous barrier layers may be positioned on the same passivation layer and/or on different passivation layers (e.g., on respective stacked passivation layers). For example, some embodiments include a plurality of additional passivation layers having a respective portion of topological change on the first passivation layer; and a plurality of additional discontinuous barrier layers. The plurality of additional discontinuous passivation layers are positioned according to at least one of the following (i) between the first passivation layer and the second passivation layer, and (ii) respective ones of the additional discontinuous barrier layers are positioned between respective portions of topological change of the additional passivation layers. In another example, some embodiments include a plurality of additional passivation layers having a respective portion of topological change on one of the first passivation layer and the second passivation layer; and a plurality of additional discontinuous barrier layers. The plurality of additional discontinuous passivation layers are positioned according to at least one of the following (i) between the first passivation layer and the second passivation layer, and (ii) respective ones of the additional discontinuous barrier layers are positioned between respective portions of topological change of the additional passivation layers.

Figure 3A:
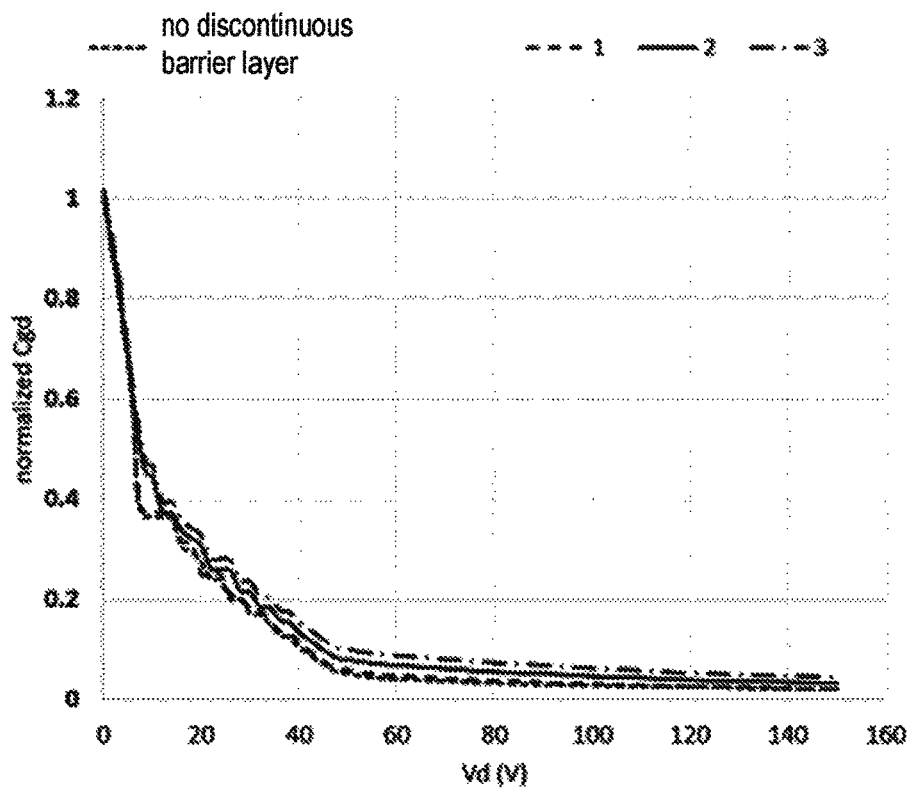
FIGS. 3A-3C are plots illustrating normalized parasitic capacitances of a simulated transistor without a discontinuous barrier layer and simulated transistors with a discontinuous barrier layer according to some embodiments of the present disclosure.
Figure 3B:
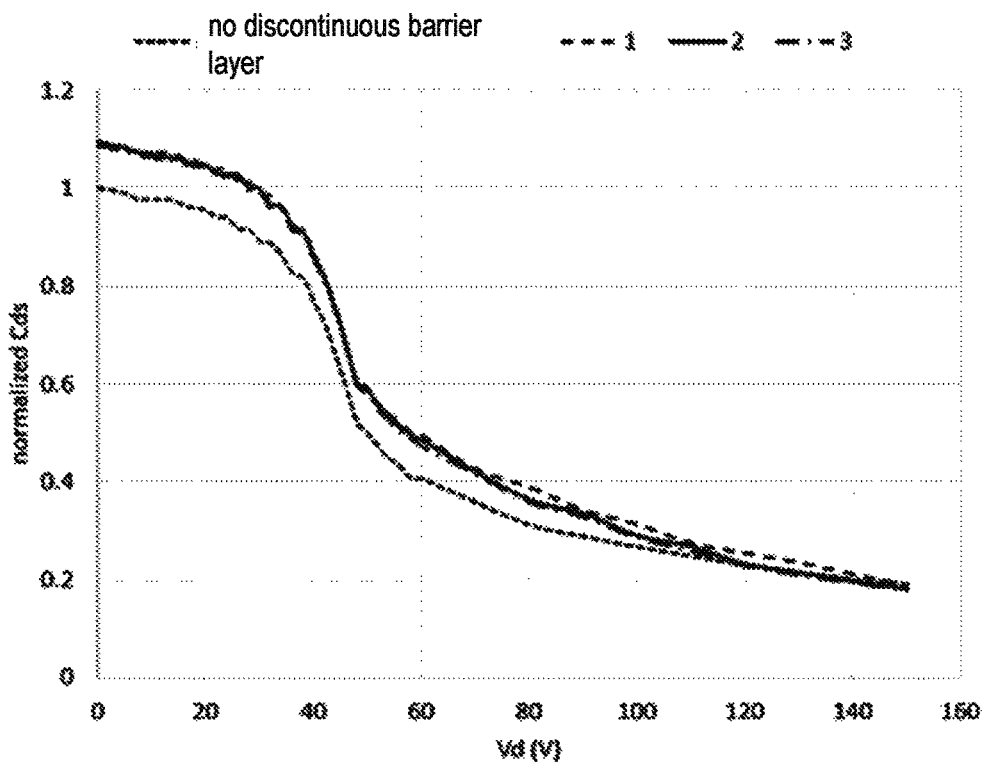
Figure 3C:
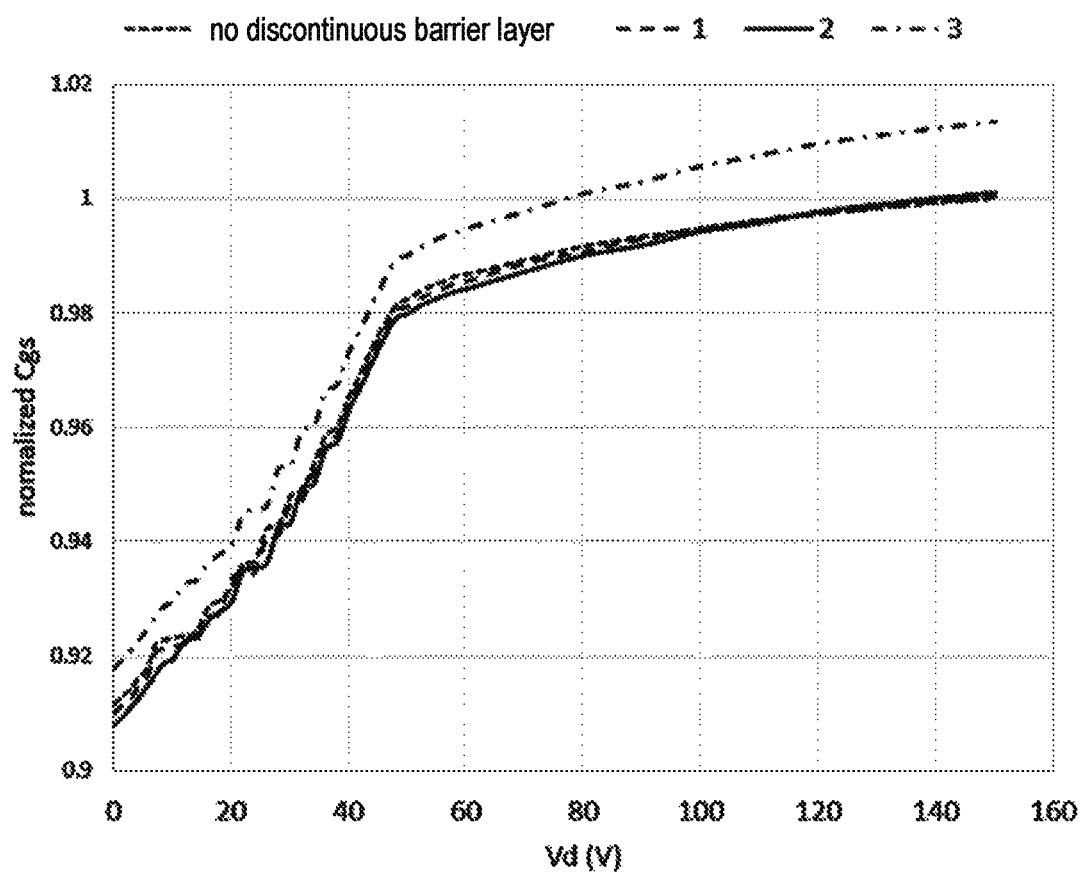

FIGS. 3A-3C are plots illustrating normalized parasitic capacitances of a simulated transistor without a discontinuous barrier layer and simulated transistors with a discontinuous barrier layer according to some embodiments of the present disclosure.

FIG. 3A shows simulated gate-drain normalized parasitic capacitances ($C_{gd}$) from a computer-aided design (CAD) simulator for a transistor having a structure approximating the structure of transistor 200A illustrated in FIG. 2A but with no discontinuous barrier layer 234; and for transistors 1, 2, and 3 having structures approximating the structures of transistors 200A, 200B, and 200C illustrated in FIGS. 2A, 2B, and 2C, respectively, in which the discontinuous barrier layer 234 has no bias connections. As illustrated in FIG. 3A, the normalized $C_{gd}$ values for the transistor having the structure approximating the structure illustrated in FIG. 2A but with no discontinuous barrier layer 234 are shown with a line having small dashes; the normalized $C_{gd}$ values for transistor 1 are shown with a line having larger dashes; the normalized $C_{gd}$ values for transistor 2 are shown with a solid line; and the normalized $C_{gd}$ values for transistor 3 are shown with a line having dashes and dots.

As shown in FIG. 3A, while the simulated normalized $C_{gd}$ values are highest for transistor 3 where the discontinuous barrier layer 234 has a length A-A' that is longer than the length of the discontinuous barrier layer 234 of the structure of transistors 1 and 2, respectively; the transistors 1, 2, and 3, respectively, maintain about a same normalized parasitic capacitance as the transistor without the discontinuous barrier layer 234.

FIG. 3B shows simulated drain-source parasitic normalized capacitance (Cds) values from the CAD simulator for a transistor having a structure approximating the structure of transistor 200A illustrated in FIG. 2A but with no discontinuous barrier layer 234; and for transistors 1, 2, and 3 having structures approximating the structures of transistors 200A, 200B, and 200C illustrated in FIGS. 2A, 2B, and 2C, respectively, where the discontinuous barrier layer 234 has no bias connections. As illustrated in FIG. 3B, the normalized Cds values for the transistor having the structure approximating the structure illustrated in FIG. 2A but with no discontinuous barrier layer 234 are shown with a line having small dashes; the normalized Cds values for transistor 1 are shown with a line having larger dashes; the normalized Cds values for transistor 2 are shown with a solid line; and the normalized Cds values for transistor 3 are shown with a line having dashes and dots.

As shown in FIG. 3B, while the simulated normalized Cds values of the transistors 1, 2, and 3 are higher at drain voltages (Vd) between 0 and about 100 than the normalized Cds values for the transistor having the structure approximating the structure illustrated in FIG. 2A but without the discontinuous barrier layer 234, the transistors 1, 2, and 3, respectively, maintain about a same normalized parasitic capacitance over as the transistor without the discontinuous barrier layer 234.

FIG. 3C shows simulated normalized gate-source parasitic capacitance (Cgs) values from the CAD simulator for a transistor having a structure approximating the structure of transistor 200A illustrated in FIG. 2A but with no discontinuous barrier layer 234; and for transistors 1, 2, and 3 having structures approximating the structures 200A, 200B, and 200C illustrated in FIGS. 2A, 2B, and 2C, respectively, where the discontinuous barrier layer 234 has no bias connections. As illustrated in FIG. 3C, the normalized Cgs values for the transistor having a structure approximating the structure illustrated in FIG. 2A but with no discontinuous barrier layer 234 are shown with a line having small dashes; the normalized Cgs values for transistor 1 are shown with a line having larger dashes; the normalized Cgs values for transistor 2 are shown with a solid line; and the normalized Cgs values for transistor 3 are shown with a line having dashes and dots.

As shown in FIG. 3C, while the simulated normalized Cgs values are highest for transistor 3 where the discontinuous barrier layer 234 has a length A-A' that is longer than the length of the discontinuous barrier layer 234 of the structure of transistors 1 and 2, respectively; the transistors 1, 2, and 3, respectively, maintain about a same normalized parasitic capacitance as the transistor without the discontinuous barrier layer 234.

It will be understood that some embodiments are described herein with reference to the structure of FIGS. 2A-2D by way of example only, and transistors described herein may be applied to transistors that include a discontinuous barrier layer(s) having a length that is longer than the length A-A' illustrated in FIGS. 2A-2D, respectively, and/or that include variations discussed herein with respect to positioning of a discontinuous barrier layer(s). Embodiments herein are in no way limited to transistors that include a discontinuous barrier layer having the lengths A-A', B-B' and positioning illustrated in FIGS. 2A-2D.

It will be further understood that some embodiments are described herein with reference to a transistor that includes one discontinuous barrier layer (e.g., FIGS. 2A-2C) by way of example only, and transistors described herein may be applied to transistors that include a plurality of discontinuous barrier layers (e.g., FIG. 2D), and embodiments herein are in no way limited to transistors having one discontinuous barrier layer.

While FIGS. 3A-3C illustrate simulated normalized parasitic capacitances for transistors having a structure approximating the structures of FIGS. 2A-2C, based on the normalized parasitic capacitance values of structures 200A-200C shown in FIGS. 3A-3C, it may be expected that such structures that include a discontinuous barrier layer having a longer length A-A' than is shown in FIGS. 2A-2B (as discussed herein) may have about the same performance as the structures corresponding to FIGS. 2A-2C. That is, transistors including such a longer discontinuous barrier layer may maintain about a same parasitic capacitance as the transistor without the discontinuous barrier layer because, e.g., increasing the length of the discontinuous barrier layer in the different respective structures 200A-200C had a relatively small impact on the parasitic capacitance values shown in FIGS. 3A-3C.

Moreover, based on FIGS. 3A-3C, it may be expected that the parasitic capacitances of transistor 200D of FIG. 2D that further includes a second barrier layer (as discussed herein) may have about the same performance as the structures corresponding to FIGS. 2A-2C. That is, transistors including such a second barrier layer may maintain about a same parasitic capacitance as the transistor without the discontinuous barrier layers because, e.g., the first and the second discontinuous barrier layers are not electrically connected to ground.

The embodiments herein may provide transistors, including HEMTs, with improved humidity robustness including, without limitation, from transistors undergoing a highly accelerated temperature and humidity stress test (HAST) such as a JEDEC HAST (e.g., JESD22A110E.01).

RF transistor amplifiers incorporating transistor devices described herein can be used in standalone RF transistor amplifiers and/or in multiple RF transistor amplifiers. Examples of how the RF transistor amplifiers according to some embodiments may be used in applications that include multiple amplifiers will be discussed with reference to FIGS. 4A-4C.

Figure 4A:
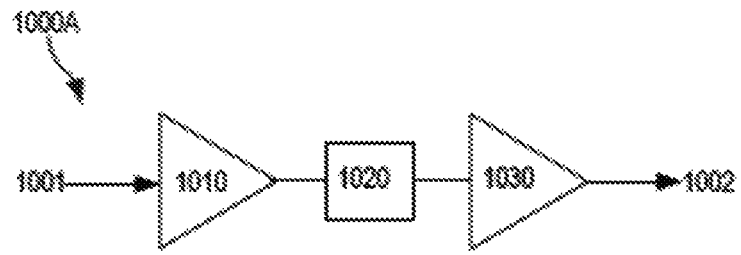
FIGS. 4A-4C are schematic block diagrams of multi-amplifier circuits in which RF transistor amplifiers incorporating transistors according to embodiments may be used.

Referring to FIG. 4A, an RF transistor amplifier 1000A is schematically illustrated that includes a pre-amplifier 1010 and a main amplifier 1030 that are electrically connected in series. As shown in FIG. 4A, RF transistor amplifier 1000A includes an RF input 1001, the pre-amplifier 1010, an inter-stage impedance matching network 1020, the main amplifier 1030, and an RF output 1002. The inter-stage impedance matching network 1020 may include, for example, inductors and/or capacitors arranged in any appropriate configuration in order to form a circuit that improves the impedance match between the output of pre-amplifier 1010 and the input of main amplifier 1030. While not shown in FIG. 4A, RF transistor amplifier 1000A may further include an input matching network that is interposed between RF input 1001 and pre-amplifier 1010, and/or an output matching network that is interposed between the main amplifier 1030 and the RF output 1002. The RF transistor amplifiers according to embodiments may be used to implement either or both of the pre-amplifier 1010 and the main amplifier 1030.

Figure 4B:
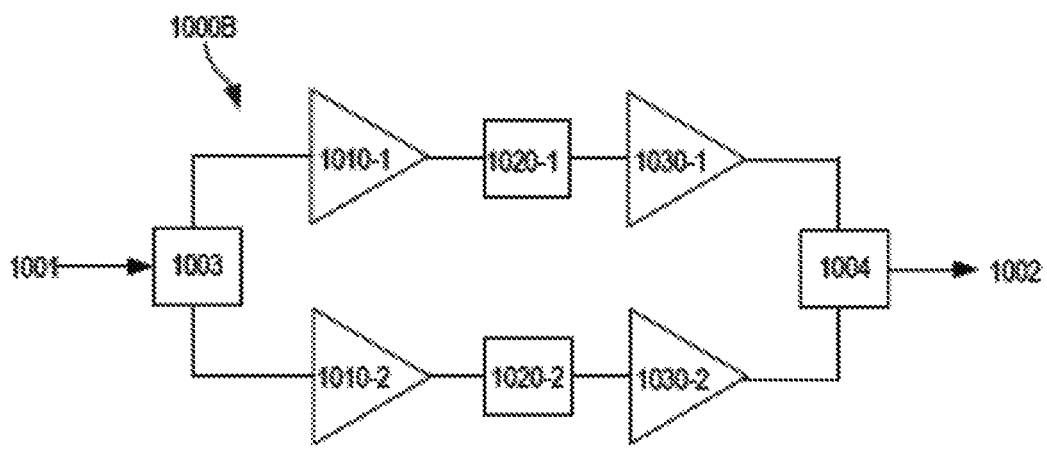

Referring to FIG. 4B, an RF transistor amplifier 1000B is schematically illustrated that includes an RF input 1001, a pair of pre-amplifiers 1010-1, 1010-2, a pair of inter-stage impedance matching networks 1020-1, 1020-2, a pair of main amplifiers 1030-1, 1030-2, and an RF output 1002. A splitter 1003 and a combiner 1004 are also provided. Pre-amplifier 1010-1 and main amplifier 1030-1 (which are electrically connected in series) are arranged electrically in parallel with pre-amplifier 1010-2 and main amplifier 1030-2 (which are electrically connected in series). As with the RF transistor amplifier 1000A of FIG. 4A, RF transistor amplifier 1000B may further include an input matching network that is interposed between RF input 1001 and pre-amplifiers 1010-1, 1010-2, and/or an output matching network that is interposed between the main amplifiers 1030-1, 1030-2 and the RF output 1002.

Figure 4C:
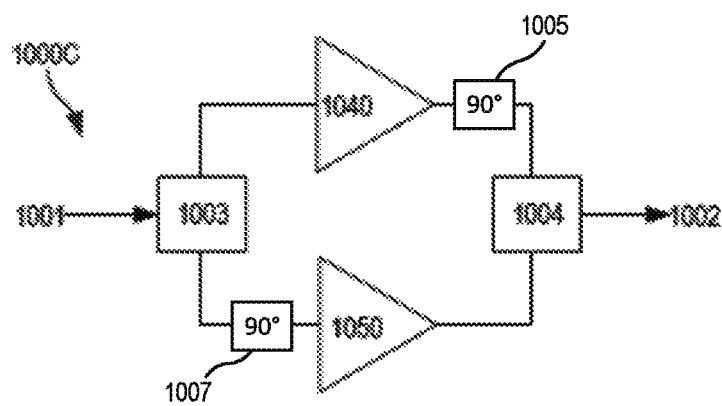

As shown in FIG. 4C, the RF transistor amplifiers according to some embodiments may also be used to implement Doherty amplifiers. As is known in the art, a Doherty amplifier circuit includes first and second (or more) power-combined amplifiers. The first amplifier is referred to as the "main" or "carrier" amplifier and the second amplifier is referred to as the "peaking" amplifier. The two amplifiers may be biased differently. For example, the main amplifier may comprise a Class AB or a Class B amplifier while the peaking amplifier may be a Class C amplifier in one common Doherty amplifier implementation. The Doherty amplifier may operate more efficiently than balanced amplifiers when operating at power levels that are backed off from saturation. An RF signal input to a Doherty amplifier is split (e.g., using a quadrature coupler), and the outputs of the two amplifiers are combined. The main amplifier is configured to turn on first (i.e., at lower input power levels) and hence only the main amplifier will operate at lower power levels. As the input power level is increased towards saturation, the peaking amplifier turns on and the input RF signal is split between the main and peaking amplifiers.

As shown in FIG. 4C, the Doherty RF transistor amplifier 1000C includes an RF input 1001, an input splitter 1003, a main amplifier 1040, a peaking amplifier 1050, an output combiner 1004 and an RF output 1002. The Doherty RF transistor amplifier 1000C includes a 900 transformer 1007 at the input of the peaking amplifier 1050 and a 900 transformer 1005 at the input of the main amplifier 1040, and may optionally include input matching networks and/or an output matching networks (not shown). The main amplifier 1040 and/or the peaking amplifier 1050 may be implemented using any of the above-described RF transistor amplifiers according to embodiments.

The RF transistor amplifiers according to embodiments may be formed as discrete devices, or may be formed as part of a Monolithic Microwave Integrated Circuit (MMIC). A MMIC refers to an integrated circuit that operates on radio and/or microwave frequency signals in which all of the circuitry for a particular function is integrated into a single semiconductor chip. An example MMIC device is a transistor amplifier that includes associated matching circuits, feed networks and the like that are all implemented on a common substrate. MMIC transistor amplifiers typically include a plurality of unit cell HEMT transistors that are connected in parallel.

Figure 5:
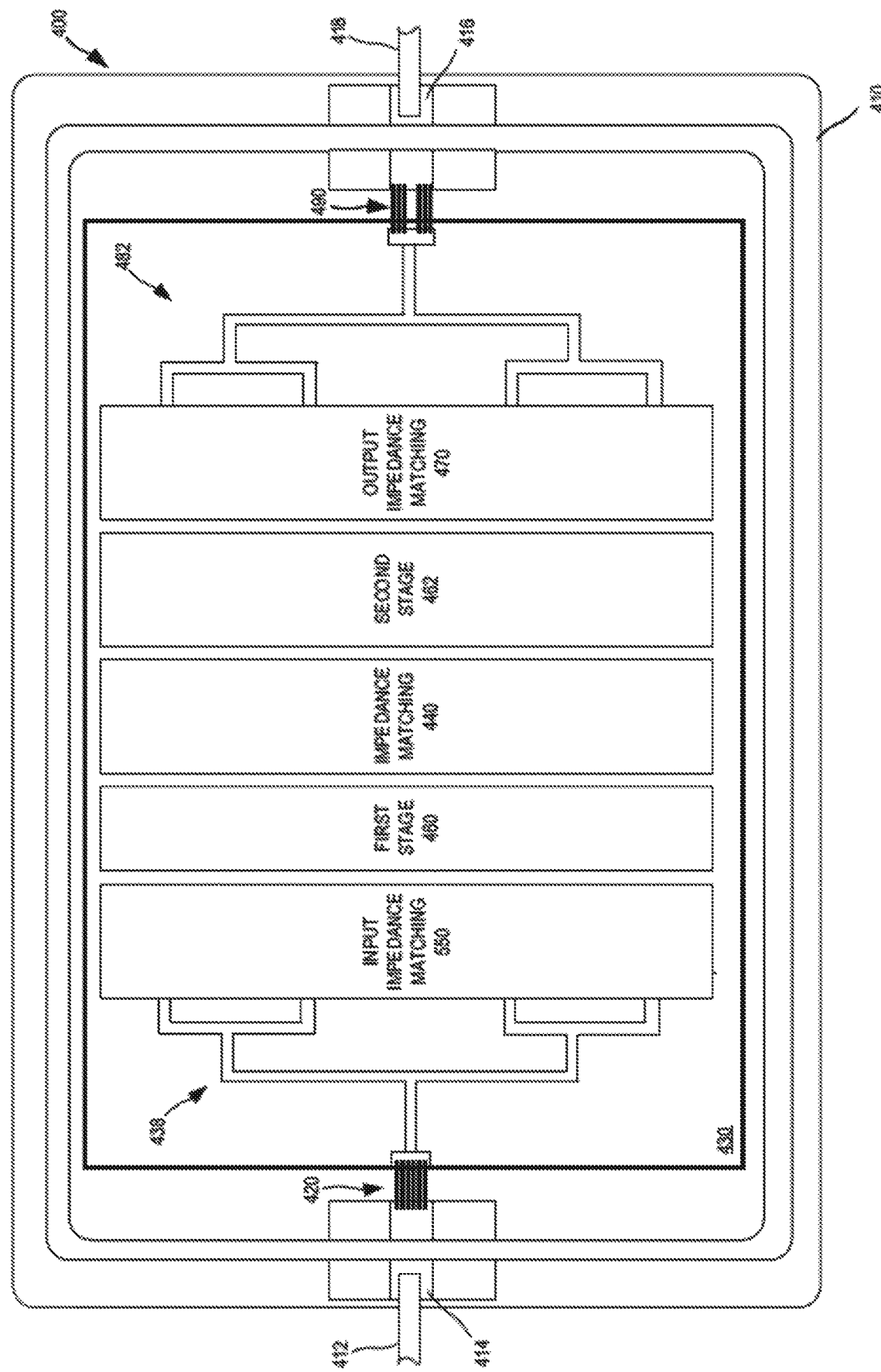
FIG. 5 is a schematic illustration of a MMIC amplifier including a HEMT transistor according to some embodiments of the present disclosure.

FIG. 5 is a plan view of a MMIC RF transistor amplifier 400 according to embodiments of the present inventive concepts. As shown in FIG. 5, the MMIC RF transistor amplifier 400 includes an integrated circuit chip 430 that is contained within a package 410. The package 410 may comprise a protective housing that surrounds and protects the integrated circuit chip 430. The package 410 may be formed of, for example, a ceramic material.

The package 410 includes an input lead 412 and an output lead 418. The input lead 412 may be mounted to an input lead pad 414 by, for example, soldering. One or more input bond wires 420 may electrically connect the input lead pad 414 to an input bond pad on the integrated circuit chip 430. The integrated circuit chip 430 includes an input feed network 438, an input impedance matching network 450, a first RF transistor amplifier stage 460, an intermediate impedance matching network 440, a second RF transistor amplifier stage 462, an output impedance matching stage 470, and an output feed network 482.

The package 410 further includes an output lead 418 that is connected to an output lead pad 416 by, for example, soldering. One or more output bond wires 490 may electrically connect the output lead pad 416 to an output bond pad on the integrated circuit chip 430. The first RF transistor amplifier stage 460 and/or the second RF transistor amplifier stage 462 may be implemented using any of the RF transistor amplifiers according to embodiments of the present inventive concepts.

The RF transistor amplifiers according to embodiments of the present inventive concepts may be designed to operate in a wide variety of different frequency bands. In some embodiments, these RF transistor amplifier dies may be configured to operate in at least one of the 0.6-2.7 GHz, 3.4-4.2 GHz, 5.1-5.8 GHz, 12-18 GHz, 18-27 GHz, 27-40 GHz or 40-75 GHz frequency bands or sub-portions thereof. The techniques according to embodiments of the present inventive concepts may be particularly advantageous for RF transistor amplifiers that operate at frequencies of 10 GHz and higher.

Figure 6A:
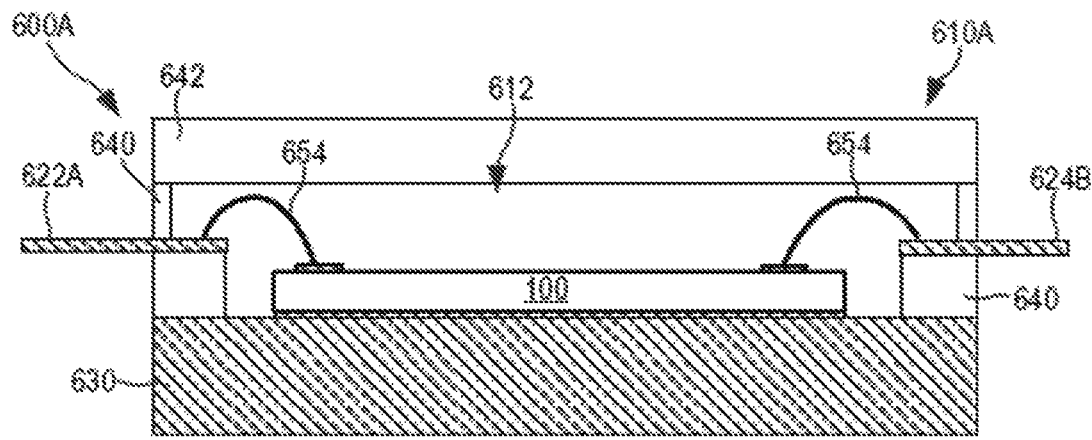
FIGS. 6A and 6B are schematic cross-sectional views illustrating example packages for RF transistor amplifier semiconductor dies according to some embodiments of the present disclosure.
Figure 6B:
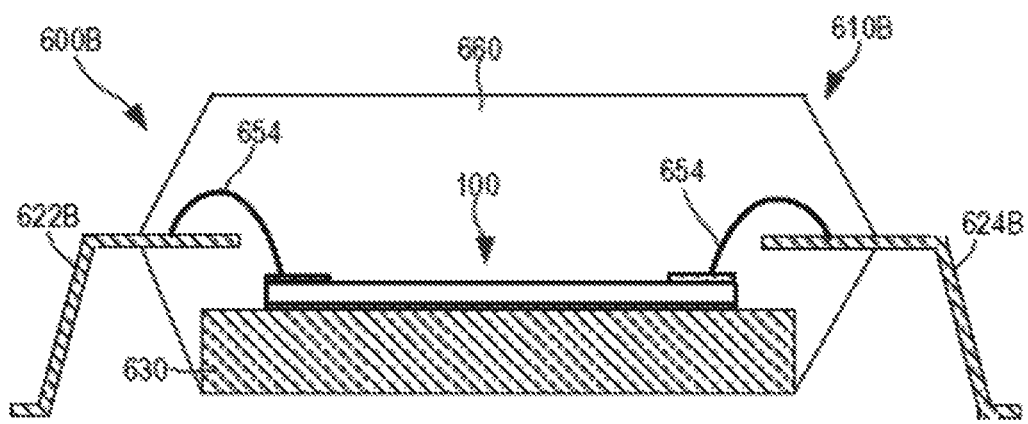

FIGS. 6A and 6B are schematic cross-sectional views illustrating several example ways that the RF transistor amplifier dies according to embodiments of the present inventive concepts may be packaged to provide packaged RF transistor amplifiers 600A and 6008, respectively.

FIG. 6A is a schematic side view of a packaged Group III nitride-based RF transistor amplifier 600A. As shown in FIG. 6A, packaged RF transistor amplifier 600A includes the RF transistor amplifier die 100 packaged in an open cavity package 610A. The package 610A includes metal gate leads 622A, metal drain leads 624A, a metal submount 630, sidewalls 640 and a lid 642.

The submount 630 may include materials configured to assist with the thermal management of the package 600A. For example, the submount 630 may include copper and/or molybdenum. In some embodiments, the submount 630 may be composed of multiple layers and/or contain vias/interconnects. In an example embodiment, the submount 630 may be a multilayer copper/molybdenum/copper metal flange that comprises a core molybdenum layer with copper cladding layers on either major surface thereof. In some embodiments, the submount 630 may include a metal heat sink that is part of a lead frame or metal slug. The sidewalls 640 and/or lid 642 may be formed of or include an insulating material in some embodiments. For example, the sidewalls 640 and/or lid 642 may be formed of or include ceramic materials.

In some embodiments, the sidewalls 640 and/or lid 642 may be formed of, for example, Al2O3. The lid 642 may be glued to the sidewalls 640 using an epoxy glue. The sidewalls 640 may be attached to the submount 630 via, for example, braising. The gate lead 622A and the drain lead 624A may be configured to extend through the sidewalls 640, though embodiments of the present inventive concepts are not limited thereto.

The RF transistor amplifier die 100 is mounted on the upper surface of the metal submount 630 in an air cavity package 612 defined by the metal submount 630, the ceramic sidewalls 640 and the ceramic lid 642. The gate and drain terminals of RF transistor amplifier die 100 may be on the top side of the structure, while the source terminal is on the bottom side of the structure.

The gate lead 622A may be connected to the gate terminal of RF transistor amplifier die 100 by one or more bond wires 654. Similarly, the drain lead 624A may be connected to the drain terminal of RF transistor amplifier die 100 by one or more bond wires 654. The source terminal may be mounted on the metal submount 630 using, for example, a conductive die attach material (not shown). The metal submount 630 may provide the electrical connection to the source terminal 126 and may also serve as a heat dissipation structure that dissipates heat that is generated in the RF transistor amplifier die 100.

The heat is primarily generated in the upper portion of the RF transistor amplifier die 100 where relatively high current densities are generated in, for example, the channel regions of the unit cell transistors. This heat may be conducted though the source vias 146 and the semiconductor layer structure of the device to the source terminal and then to the metal submount 630.

FIG. 6B is a schematic side view of another packaged Group III nitride based RF transistor amplifier 600B. RF transistor amplifier 600B differs from RF transistor amplifier 600A in that it includes a different package 610B. The package 610B includes a metal submount 630, as well as metal gate and drain leads 622B, 624B. RF transistor amplifier 600B also includes a plastic overmold 660 that at least partially surrounds the RF transistor amplifier die 100, the leads 622B, 624B, and the metal submount 630.

Many variations of the features of the above embodiments are possible. Transistor structures with features that may be used in embodiments of the present invention are disclosed in the following commonly assigned publications, the contents of each of which are fully incorporated by reference herein in their entirety: U.S. Pat. No. 6,849,882 to Chavarkar et al. and entitled "Group-III Nitride Based High Electron Mobility Transistor (HEMT) With Barrier/Spacer Layer"; U.S. Pat. No. 7,230,284 to Parikh et al. and entitled "Insulating Gate AlGaN/GaN HEMT"; U.S. Pat. No. 7,501,669 to Parikh et al. and entitled "Wide Bandgap Transistor Devices With Field Plates"; U.S. Pat. No. 7,126,426 to Mishra et al. and entitled "Cascode Amplifier Structures Including Wide Bandgap Field Effect Transistor With Field Plates"; U.S. Pat. No. 7,550,783 to Wu et al. and entitled "Wide Bandgap HEMTs With Source Connected Field Plates"; U.S. Pat. No. 7,573,078 to Wu et al. and entitled "Wide Bandgap Transistors With Multiple Field Plates"; U.S. Pat. Pub. No. 2005/0253167 to Wu et al. and entitled "Wide Bandgap Field Effect Transistors With Source Connected Field Plates"; U.S. Pat. Pub. No. 2006/0202272 to Wu et al. and entitled "Wide Bandgap Transistors With Gate-Source Field Plates"; U.S. Pat. Pub. No. 2008/0128752 to Wu and entitled "GaN Based HEMTs With Buried Field Plates"; U.S. Pat. Pub. No. 2010/0276698 to Moore et al. and entitled "Gate Electrodes For Millimeter-Wave Operation and Methods of Fabrication; U.S. Pat. Pub. No. 2012/0049973 to Smith, Jr. et al. and entitled "High Power Gallium Nitride Field Effect Transistor Switches"; U.S. Pat. Pub. No. 2012/0194276 to Fisher and entitled "Low Noise Amplifiers Including Group III Nitride Based High Electron Mobility Transistors"; and U.S. Pat. No. 9,847,411 to Sriram et al. entitled "Recessed field plate transistor structures."

Although embodiments of the inventive concepts have been described in considerable detail with reference to certain configurations thereof, other versions are possible. The indentations of an edge of an ohmic contact can also have many different sizes and shapes. Accordingly, the spirit and scope of the invention should not be limited to the specific embodiments described above.

What is claimed is:

1. A transistor comprising:
   a first passivation layer on a semiconductor layer of the transistor between a source contact and a drain contact, the first passivation layer comprising a portion having a topological change; and
   a discontinuous barrier layer on the portion of the first passivation layer having the topological change, wherein the discontinuous barrier layer is configured to reduce ingress of moisture in the portion of the first passivation layer.

2. The transistor of claim 1, further comprising:
   a gate contact between the source contact and the drain contact; and
   a field plate on a portion of the gate contact adjacent to the drain contact, wherein the portion of the first passivation layer having the topological change is on the field plate and the discontinuous barrier layer is on the portion of the first passivation layer.

3. The transistor of claim 1, wherein the discontinuous barrier layer has a thickness that is in a range between about 25 nm to about 600 nm.

4. The transistor of claim 2, wherein the field plate has a thickness that is thicker than a thickness of the discontinuous barrier layer.

5. The transistor of claim 3, wherein the thickness of the field plate is greater than about 600 nm and the thickness of the discontinuous barrier layer is in a range between about 25 nm to less than about 600 nm.

6. The transistor of claim 2, wherein the discontinuous barrier layer is a metal layer formed by a single metal comprising one of aluminum, gold, silver, silicon, titanium, and tantalum and the gate contact, the source contact, and the field plate, respectively, comprises a plurality of metals.

7. The transistor of claim 6, wherein the plurality of metals does not include aluminum.

8. The transistor of claim 4, wherein the discontinuous barrier layer does not contact to an electrical ground.

9. The transistor of claim 1, further comprising:
   a second passivation layer on the first passivation layer; and
   wherein the discontinuous barrier layer is between the first passivation layer and the second passivation layer.

10. The transistor of claim 1, wherein the discontinuous barrier layer extends over an entirety of the portion having the topological change.

11. The transistor of claim 1, wherein the discontinuous barrier layer partially extends over the portion having the topological change.

12. The transistor of claim 1, wherein the discontinuous barrier layer at least partially extends over the portion having the topological change adjacent the source contact.

13. The transistor of claim 1, wherein the discontinuous barrier layer extends at least partially over the portion having the topological change adjacent the drain contact.

14. The transistor of claim 2, wherein a length of the discontinuous barrier layer has a first end that extends from about a first edge of the gate contact and a second end that is closer to the first edge of the gate contact than to the drain contact.

15. The transistor of claim 2, wherein a length of the discontinuous barrier layer has a first end that that extends from a portion of the gate contact and a second end that is closer to a first edge of the gate contact than to the drain contact.

16. The transistor of claim 2, wherein a length of the discontinuous barrier layer has a first end the covers the gate contact and a second end that is closer to a first edge of the gate contact than to the drain contact.

17. The transistor of claim 2, wherein a length of the discontinuous barrier layer has a first end that extends from about a first edge of the gate contact and a second end that is closer to the drain contact than to the first edge of the gate contact.

18. The transistor of claim 2, wherein a length of the discontinuous barrier layer has a first end that that extends from a portion of the gate contact and a second end that is closer to the drain contact than to a first edge of the gate contact.

19. The transistor of claim 2, wherein a length of the discontinuous barrier layer has a first end the covers the gate contact and a second end that is closer to the drain contact than to a first edge of the gate contact.

20. The transistor of claim 1, further comprising:
a plurality of additional passivation layers having a respective portion of topological change on the first passivation layer; and
a plurality of additional discontinuous barrier layers, wherein the plurality of additional discontinuous passivation layers are positioned according to at least one of the following (i) between the first passivation layer and the second passivation layer, and (ii) respective ones of the additional discontinuous barrier layers are positioned between respective portions of topological change of the additional passivation layers.

21. The transistor of claim 1, wherein the transistor comprises a high electron mobility transistor, HEMT.

22. A transistor comprising:
a first passivation layer on a semiconductor layer of the transistor between a source contact and a drain contact, the first passivation layer comprising a first portion having a topological change;
a first discontinuous barrier layer on the first portion of the first passivation layer having the topological change;
a second passivation layer on the first passivation layer on the semiconductor layer of the transistor between the source contact and the drain contact, the second passivation layer comprising a second portion having a topological change; and
a second discontinuous barrier layer on the second portion of the second passivation layer having the topological change, wherein the first and the second discontinuous barrier layers are configured to reduce ingress of moisture in the portions of the first and second passivation layers.

23. The transistor of claim 22, further comprising:
a gate contact between the source contact and the drain contact; and
a field plate on a portion of the gate contact adjacent to the drain contact, wherein the portion of the first passivation layer having the topological change is on the field plate and the first discontinuous barrier layer is on the portion of the first passivation layer, and the second discontinuous barrier layer is on the portion of the second passivation layer.

24. The transistor of claim 22, wherein the first and the second discontinuous barrier layers, respectively, have a thickness that is in a range between about 25 nm to about 600 nm.

25. The transistor of claim 23, wherein the field plate has a thickness that is thicker than a thickness of the first and the second discontinuous barrier layers.

26. The transistor of claim 25, wherein the thickness of the field plate is greater than about 600 nm and the thickness of the first and the second discontinuous barrier layers, respectively, is in a range between about 25 nm to less than about 600 nm.

27. The transistor of claim 23, wherein the first and the second discontinuous barrier layers, respectively, is a metal layer formed by a single metal comprising one of aluminum, gold, silver, silicon, titanium, and tantalum and the gate contact, the source contact, and the field plate, respectively, comprises a plurality of metals.

28. The transistor of claim 27, wherein the plurality of metals does not include aluminum.

29. The transistor of claim 23, wherein the first and the second discontinuous barrier layers, respectively, do not contact to an electrical ground.

30. The transistor of claim 22, further comprising:
a third passivation layer on the second passivation layer; and
wherein the first discontinuous barrier layer is between the first passivation layer and the second passivation layer, and the second discontinuous barrier layer is between the second passivation layer and the third passivation layer.

31. The transistor of claim 22, wherein at least one of the first and the second discontinuous barrier layers, respectively, extends over an entirety of the respective first portion and/or second portion having the topological change.

32. The transistor of claim 22, wherein at least one of the first and the second discontinuous barrier layers, respectively, partially extends over the respective first portion and/or second portion having the topological change.

33. The transistor of claim 22, wherein at least one of the first and the second discontinuous barrier layers, respectively, at least partially extends over the respective first portion and/or second portion having the topological change adjacent the source contact.

34. The transistor of claim 22, wherein at least one of the first and the second discontinuous barrier layers, respectively, extends at least partially over the respective first portion and/or second portion having the topological change adjacent the drain contact.

35. The transistor of claim 23, wherein the second discontinuous barrier layer has a first end that extends from about a first edge of the gate contact and a second end that covers at least a portion of the gate contact and/or the field plate.

36. The transistor of claim 23, wherein a length of the first discontinuous barrier layer has a first end that extends from about a first edge of the gate contact and a second end that is closer to the first edge of the gate contact than to the drain contact.

37. The transistor of claim 23, wherein a length of the first discontinuous barrier layer has a first end that that extends from a portion of the gate contact and a second end that is closer to a first edge of the gate contact than to the drain contact.

38. The transistor of claim 23, wherein a length of the first discontinuous barrier layer has a first end the covers the gate contact and a second end that is closer to a first edge of the gate contact than to the drain contact.

39. The transistor of claim 23, wherein a length of the first discontinuous barrier layer has a first end that extends from about a first edge of the gate contact and a second end that is closer to the drain contact than to the first edge of the gate contact.

40. The transistor of claim 23, wherein a length of the first discontinuous barrier layer has a first end that that extends from a portion of the gate contact and a second end that is closer to the drain contact than to a first edge of the gate contact.

41. The transistor of claim 23, wherein a length of the first discontinuous barrier layer has a first end the covers the gate contact and a second end that is closer to the drain contact than to a first edge of the gate contact.

42. The transistor of claim 22, further comprising:
   a plurality of additional passivation layers having a respective portion of topological change on one of the first passivation layer and the second passivation layer; and
   a plurality of additional discontinuous barrier layers, wherein the plurality of additional discontinuous passivation layers are positioned according to at least one of the following (i) between the first passivation layer and the second passivation layer, and (ii) respective ones of the additional discontinuous barrier layers are positioned between respective portions of topological change of the additional passivation layers.

43. The transistor of claim 21, wherein the transistor comprises a high electron mobility transistor, HEMT.

* * * * *